US010283405B2

(12) United States Patent
Okada et al.

(10) Patent No.: US 10,283,405 B2
(45) Date of Patent: May 7, 2019

(54) METHOD AND APPARATUS FOR FORMING SILICON FILM AND STORAGE MEDIUM

(71) Applicant: TOKYO ELECTRON LIMITED, Tokyo (JP)

(72) Inventors: Mitsuhiro Okada, Nirasaki (JP); Satoshi Takagi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/473,489

(22) Filed: Mar. 29, 2017

(65) Prior Publication Data

US 2017/0287778 A1 Oct. 5, 2017

(30) Foreign Application Priority Data

Mar. 30, 2016 (JP) ................................ 2016-068449

(51) Int. Cl.

| | |
|---|---|
| ***H01L 21/76*** | (2006.01) |
| ***H01L 21/768*** | (2006.01) |
| ***C23C 16/02*** | (2006.01) |
| ***C23C 16/04*** | (2006.01) |
| ***C23C 16/24*** | (2006.01) |
| ***C23C 16/52*** | (2006.01) |
| ***C23C 16/455*** | (2006.01) |

(Continued)

(52) U.S. Cl.
CPC .... *H01L 21/76882* (2013.01); *C23C 16/0272* (2013.01); *C23C 16/045* (2013.01); *C23C 16/24* (2013.01); *C23C 16/4412* (2013.01); *C23C 16/45523* (2013.01); *C23C 16/52* (2013.01); *H01L 21/32055* (2013.01); *H01L 21/32135* (2013.01); *H01L 21/76802* (2013.01); *H01L 21/76879* (2013.01)

(58) Field of Classification Search
CPC ......... H01L 21/32055; H01L 21/76882; C23C 16/0272
USPC .......................................................... 438/435
See application file for complete search history.

(56) References Cited

U.S. PATENT DOCUMENTS

2004/0241956 A1* 12/2004 Eun .................. H01L 21/76224 438/424
2009/0124077 A1 5/2009 Okada et al.
(Continued)

FOREIGN PATENT DOCUMENTS

JP 10-56154 A 2/1998
JP 2012-4542 A 1/2012

*Primary Examiner* — David S Blum
(74) *Attorney, Agent, or Firm* — Nath, Goldberg & Meyer; Jerald L. Meyer

(57) ABSTRACT

A silicon film forming method of forming a silicon film in a recess with respect to a target substrate having on its surface an insulating film in which the recess is formed. The method includes (a) forming a first silicon film filling the recess by supplying a Silicon raw material gas onto the target substrate, (b) subsequently, etching the first silicon film by supplying a halogen-containing etching gas onto the target substrate such that surfaces of the insulating film on the target substrate and on an upper portion of an inner wall of the recess are exposed and such that the first silicon film remains in a bottom portion of the recess, and (c) subsequently, growing a second silicon film in a bottom-up growth manner on the first silicon film that remains in the recess by supplying a Silicon raw material gas onto the target substrate after the etching.

15 Claims, 10 Drawing Sheets

(51) Int. Cl.

| | |
|---|---|
| ***C23C 16/44*** | (2006.01) |
| ***H01L 21/3205*** | (2006.01) |
| ***H01L 21/3213*** | (2006.01) |

(56) References Cited

U.S. PATENT DOCUMENTS

| | | | |
|---|---|---|---|
| 2011/0287629 | A1 | 11/2011 | Kakimoto et al. |
| 2013/0248995 | A1 | 9/2013 | Nishiwaki et al. |
| 2015/0056791 | A1 | 2/2015 | Onodera et al. |
| 2017/0253989 | A1 | 9/2017 | Chiba et al. |

* cited by examiner

METHOD AND APPARATUS FOR FORMING SILICON FILM AND STORAGE MEDIUM

CROSS-REFERENCE TO RELATED APPLICATION

This application claims the benefit of Japanese Patent Application No. 2016-068449, filed on Mar. 30, 2016, in the Japan Patent Office, the disclosure of which is incorporated herein in its entirety by reference.

TECHNICAL FIELD

The present disclosure relates to a silicon film forming method and apparatus for forming a silicon film in a recess.

BACKGROUND

A manufacturing process of a semiconductor device includes a process of forming a recess, such as a hole or a trench, in an insulating film and of filling the same with a silicon film, such as an amorphous silicon film so as to form an electrode. In general, a chemical vapor deposition (CVD) method has been used for the silicon film forming process. However, when a CVD method is used to fill a deep hole or trench with a silicon film, the step coverage becomes poor, resulting in the creation of voids. Voids created in the silicon film to be used as an electrode increase the resistance. Accordingly, the silicon film having as less voids as possible is required.

In contrast, for example, a technique has been proposed in which a silicon film is formed in a recess such as a hole or a trench and is etched in a V-shaped cross-section, and in which the recess is then filled with a silicon film again. According to this technique, a void-free filling can be achieved.

However, in recent years, the semiconductor devices have become smaller. In addition, the width of a recess to be filled with a silicon film has also become narrower. Thus, it is difficult to make a void-free filling by means of the V-shaped etching technique as described in the related art.

SUMMARY

Some embodiments of the present disclosure provide a silicon film forming method and apparatus for filling a very fine recess with a silicon film without voids.

According to one embodiment of the present disclosure, there is provided a silicon film forming method of forming a silicon film in a recess with respect to a target substrate having on its surface an insulating film in which the recess is formed therein, the method including: (a) forming a first silicon film to fill the recess by supplying a Silicon raw material gas onto the target substrate; (b) subsequently, etching the first silicon film by supplying a halogen-containing etching gas onto the target substrate such that surfaces of the insulating film on the surface of the target substrate and on an upper portion of an inner wall of the recess are exposed and such that the first silicon film remains in a bottom portion of the recess, and (c) subsequently, growing a second silicon film in a bottom-up growth manner on the first silicon film that remains in the bottom portion of the recess by supplying a Silicon raw material gas onto the target substrate after the etching.

According to one embodiment of the present disclosure, there is provided a silicon film forming apparatus for forming a silicon film in a recess with respect to a target substrate that having on its surface an insulating film in which the recess is formed therein, the apparatus including: a process chamber configured to receive the target substrate; a gas supply unit configured to supply a predetermined gas into the process chamber; a heating mechanism configured to heat an interior of the process chamber; an exhaust mechanism configured to evacuate and depressurize the process chamber; and a controller configured to control the gas supply unit, the heating mechanism, and the exhaust mechanism, wherein the controller controls such that: the process chamber is controlled to a predetermined depressurized state by the exhaust mechanism and to a predetermined temperature by the heating mechanism; a first silicon film is formed to fill the recess by supplying a Silicon raw material gas into the process chamber from the gas supply unit; the first silicon film is etched by supplying a halogen-containing etching gas into the process chamber from the gas supply unit such that surfaces of the insulating film on the surface of the target substrate and on an upper portion of an inner wall of the recess are exposed and such that the first silicon film remains in a bottom portion of the recess; and a second silicon film is grown up in a bottom-up growth manner on the first silicon film that remains in the bottom portion of the recess by supplying a Silicon raw material gas onto the target substrate after the etching.

According to one embodiment of the present disclosure, there is provided a non-transitory computer-readable storage medium that stores a program causing a computer to control a silicon film forming apparatus, wherein the program, when it is executed, causes the computer to control the silicon film forming apparatus to perform the silicon film forming method described above.

BRIEF DESCRIPTION OF THE DRAWINGS

The accompanying drawings, which are incorporated in and constitute a part of, the specification, illustrate embodiments of the present disclosure, and together with the general description given above and the detailed description of the embodiments given below, serve to explain the principles of the present disclosure.

DETAILED DESCRIPTION

Hereinafter, embodiments of the present disclosure will be described with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Silicon Film Forming Method>

First Embodiment

Figure 1:
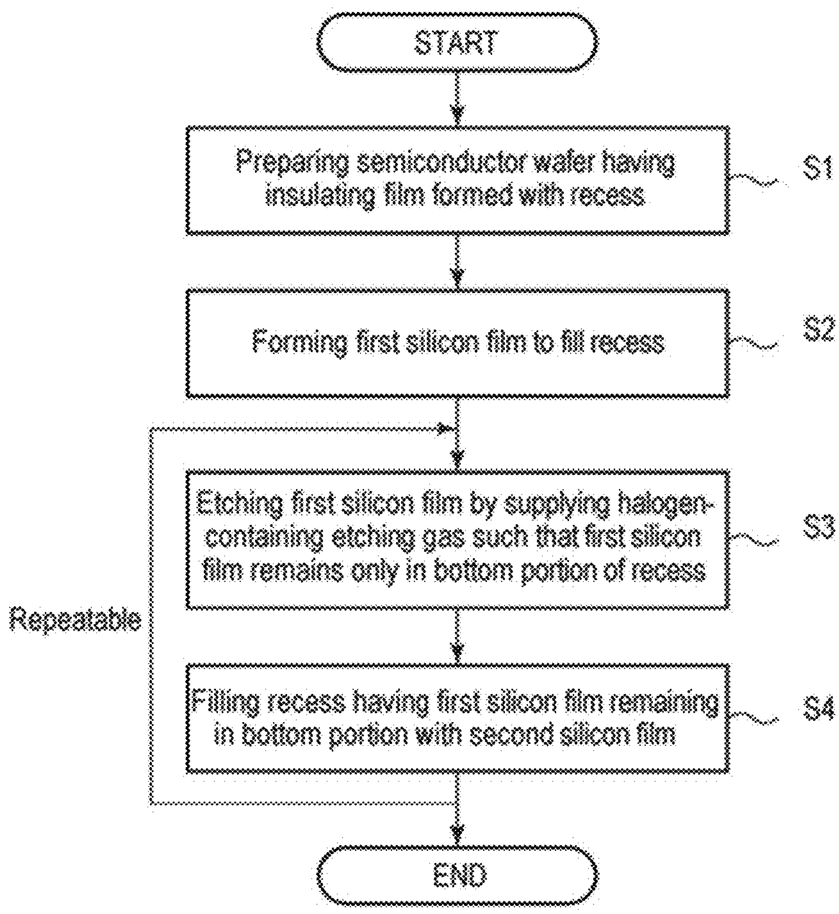
FIG. 1 is a flowchart showing the first embodiment of a silicon film forming method, according to the present disclosure.

First, a first embodiment of a silicon film forming method according to the present disclosure will be described with reference to a flowchart of FIG. 1 and procedural sectional views of FIGS. 2A to 2D.

First, a semiconductor wafer (hereinafter, simply referred to as a wafer) is prepared, in which an insulating film 201 is provided. The insulating film 201 is formed of a $SiO_2$ film or a SiN film. A recess 202 such as a trench or a hole is formed in the insulating film 201 using a predetermined pattern (Step S1, FIG. 2A).

The recess 202, for example, may have an opening diameter or an opening width of about 5 to 40 nm and a depth of about 50 to 300 nm.

Figures 2A, 2B, 2C, 2D:
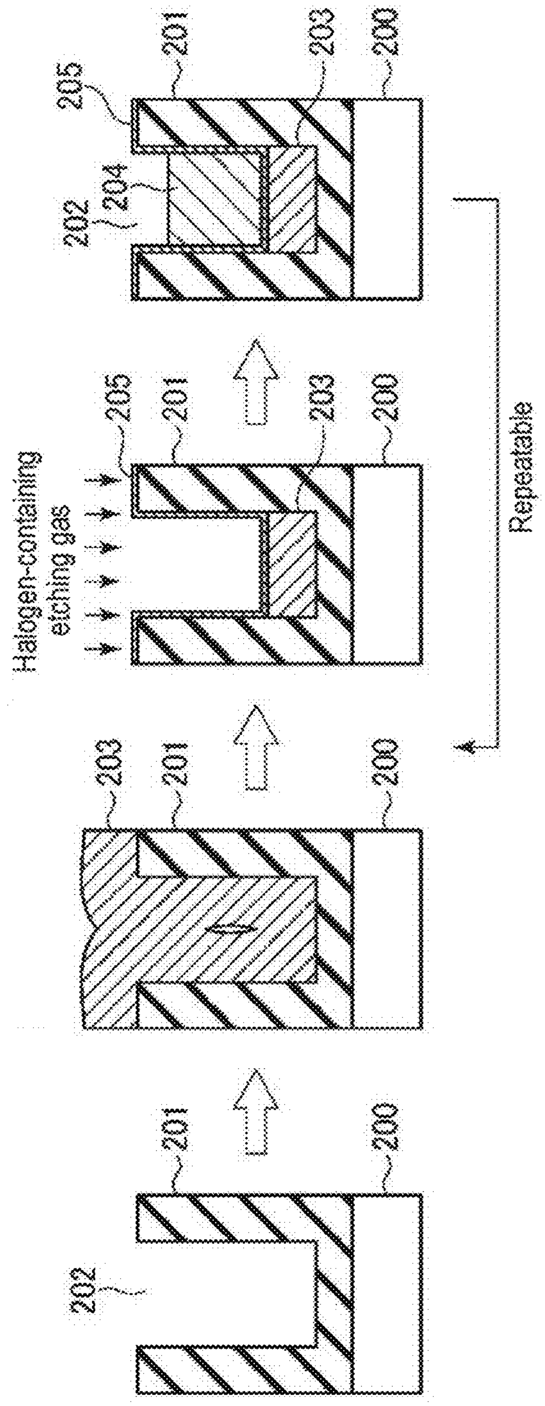
FIGS. 2A to 2D are procedural sectional views showing the first embodiment of a silicon film forming method, according to the present disclosure.

Next, a first film forming process is performed to form a first silicon film 203 to fill the recess 202 by supplying a Si raw material gas onto the wafer (Step S2, FIG. 2B). At this time, the filling of the recess 202 is preferably performed until the recess 202 is almost completely filled. Typically, the first silicon film 203 is an amorphous silicon in a state where it was formed into a film. The first silicon film 203 may be a non-doped silicon, or may be an impurity-doped silicon. Examples of the impurities include boron (B), phosphorus (P), arsenic (As), or the like.

As a Si raw material gas, all of the Si-containing compounds that can be applied to the CVD method may be used. Silane-based compounds and amino-silane-based compounds may be properly used but the present disclosure is not limited thereto. Examples of the silane-based compounds include, for example, monosilane ($SiH_4$), disilane ($Si_2H_6$), or the like. The amino-silane-based compounds may be, for example, BAS (butyl-amino-silane), BTBAS (bistert-butyl-amino-silane), DMAS (dimethyl-amino-silane), BDMAS (bisdimethyl-amino-silane), DPAS (dipropyl-amino-silane). DIPAS (diisopropylamino-silane), or the like. Of course, other silane-based compounds or amino-silane-based compounds may be used.

As an impurity-containing gas, diborane ($B_2H_6$), boron trichloride ($BCl_3$), phosphine ($PH_3$), or arsine ($AsH_3$) may be used.

Detailed processing conditions may include a processing temperature (wafer-temperature) of 300 to 600 degrees C. and a pressure of 0.05 to 5 Torr (6.7 to 667 Pa).

Subsequently, the first silicon film 203 formed in the first film forming process is etched by supplying a halogen-containing etching gas onto the wafer such that the first silicon film 203 remains only in the bottom portion of the recess 202 (Step S3 in FIG. 2C).

The first silicon film 203 is etched from the surface thereof because the etching gas is supplied from the top. Accordingly, by etching the first silicon film 203, it is possible to allow the first silicon film 203 to remain only in the bottom portion of the recess 202 and to allow the insulating film 201 in the surface thereof and the upper portion of the recess 202 to be in an exposed state.

A gas that contains a halogen element and that can etch the silicon may be used as the halogen-containing etching gas, and the halogen-containing etching gas may be, for example, $Cl_2$, HCl, $F_2$, $Br_2$, HBr, or the like. Among them, a $Cl_2$ gas is preferable because it has an excellent etching controllability. At this time, the etching temperature is preferably in the range of 250 to 500 degrees C., and the pressure thereof is preferably in the range of 0.05 to 5 Torr (6.7 to 667 Pa). At this time, the halogen-containing etching gas is adsorbed onto the surface of the wafer to form an adsorption layer 205 as shown in FIG. 2C.

Next, a second film forming process is performed to form a second silicon film 204 in the recess 202 in which the first silicon film 203 remains in the bottom portion by supplying a Si raw material gas onto the wafer (Step S4, FIG. 2D). Like the first silicon film 203, the second silicon film 204 is typically an amorphous silicon when it is formed into a film. The second silicon film 204 may be a non-doped silicon film, or may be an impurity-doped silicon film. The impurities may be arsenic (As), boron (B), phosphorus (P), or the like. The Si raw material gas and the impurity-containing gas may be the same as, or different from, that of the first silicon film 203. At this time, the Silicon raw material gas that can be used for forming the second silicon film 204 may be the same as, or different from, the Silicon raw material gas that is used for the first silicon film 203.

Like Step S2, detailed processing conditions may include a processing temperature (wafer-temperature) of 300 to 600 degrees C. and a pressure of 0.05 to 5 Torr (6.7 to 667 Pa).

Figure 3:
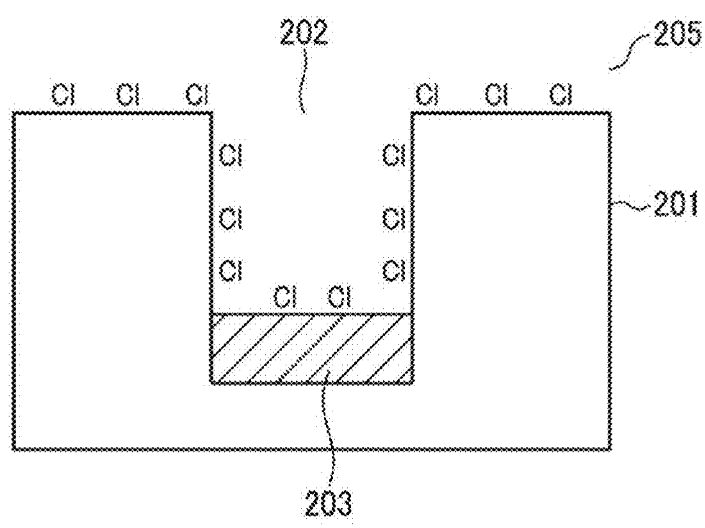
FIG. 3 is a view for explaining the state of a recess when it is etched by means of a halogen-containing etching gas.

The formation of the second silicon film 204 in Step S4 is performed in a state in which the halogen-containing etching gas (for example, a $Cl_2$ gas) has been adsorbed onto the exposed surface of the insulating film 201 and onto the upper surface of the first silicon film 203 so as to form the adsorption layer 205 in the etching process of the previous Step S3 as shown in FIG. 3.

At this time, the surface of the insulating film formed of $SiO_2$ becomes inactive because the adsorption layer 205 containing a halogen element such as Cl is formed thereon. Meanwhile, the silicon film hardly becomes inactive regardless of whether it is impurity doped or not, even if the adsorption layer 205 containing a halogen element is formed.

That is, when the halogen element such as Cl contained in the etching gas is adsorbed onto the insulating film 201 formed of $SiO_2$ or the like, it serves to inhibit the formation of the silicon film. However, when the halogen element such as Cl is adsorbed onto the silicon film the formation of film on the silicon film is hardly inhibited.

Figure 4:
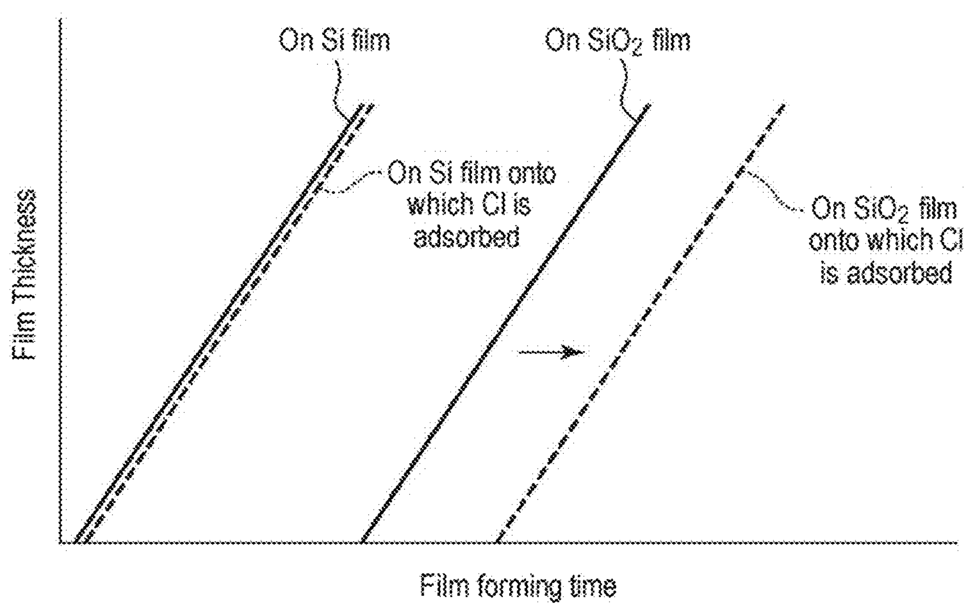
FIG. 4 is a view showing a change in the incubation time in the silicon film forming method when a halogen element is adsorbed onto a $SiO_2$ film and onto a silicon film.

This can be confirmed from the view point of an incubation time by referring to FIG. 4.

In general, there is no incubation time when forming a silicon film on the silicon film. On the other hand, there is a predetermined incubation time when forming a silicon film on the $SiO_2$ insulating film. In this a state, when the adsorption layer 205 containing the halogen element is formed on the surface, the incubation time hardly increases in case of the silicon film, whereas the incubation time further increases in case of the $SiO_2$ film.

Figure 5:
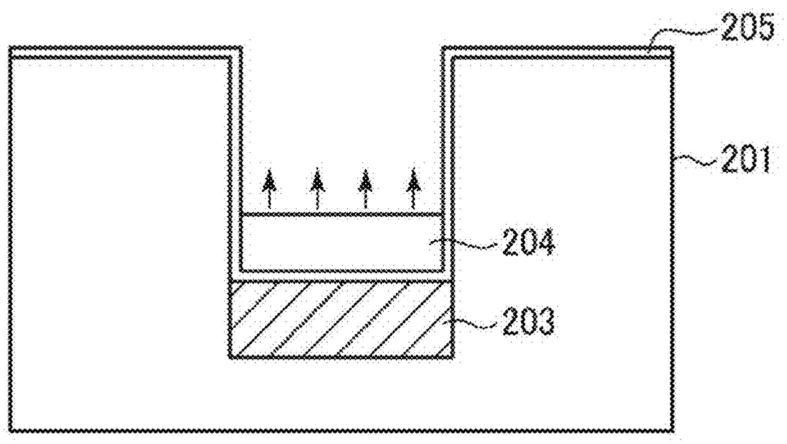
FIG. 5 is a schematic view showing the state of a bottom-up growth when the second silicon film is formed in the recess.

Therefore, in the recess 202, it is possible to make a state in which the second silicon film 204 is not formed on the insulating film 201 due to the adsorption layer 205 containing a halogen element while the second silicon film 204 is formed on the first silicon film 203. That is, the second silicon film 204 can grow upward in a bottom-up growth manner on the first silicon film 203 that remains in the bottom portion of the recess 202 by means of the adsorption layer 205 containing a halogen element as shown in FIG. 5. Due to this, a void-free silicon film can be formed even with a fine recess 202.

Figure 6A:
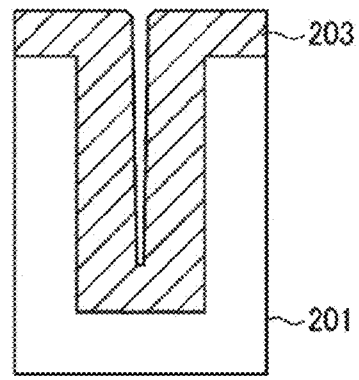
FIGS. 6A to 6C are views for explaining a conventional silicon film forming method.
Figure 6B:
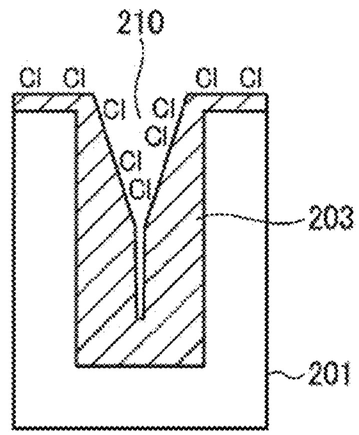
Figure 6C:
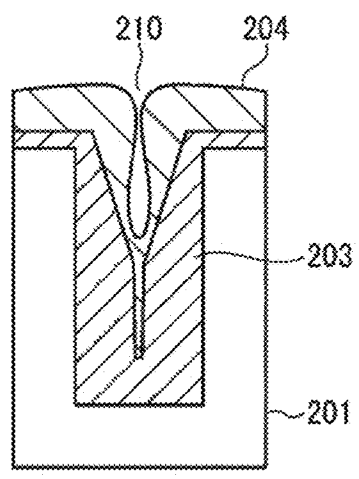

Even in the related art, the first silicon film 203 is formed in the recess 202 and is then etched as shown in FIG. 6A. However, since the etching above is performed in order to form an etched portion 210 in a V-shape as shown in FIG. 6B, the first silicon film 203 still remains on the surface of the wafer and on the inner wall portion of the etched portion 210. Thus, though the etching gas of $Cl_2$ is adsorbed onto the surface of the wafer and onto the inner wall portion of the etched portion 210, the second silicon film 204 can be formed on the surface of the wafer and on the inner wall portion of the etched portion 210 during forming the second silicon film 204 as a subsequent step. Therefore, as shown in FIG. 6C, when the recess 202 is very small, the width of the etched portion 210 may become narrow despite the V-shaped etched portion 210. As a result, there is a possibility that this makes it difficult to fill the recess without voids.

On the contrary, in the present embodiment, since the second silicon film 204 grows up in a bottom-up growth manner as described above, the problem described in the related art can be prevented.

The etching of Step S3 and the second film forming process of Step S4 may be performed one time, or may be repeated several times until the film reaches a predetermined filling height.

The first film forming process of Step S2, the etching process of Step S3, and the second film forming process of Step S4 may be preferably conducted at as similar a temperature as possible, or, more preferably, may be conducted at the same temperature.

In the first embodiment, both the first silicon film 203 and the second silicon film 204 may be non-doped silicon films, or may be doped silicon films with boron or the like.

Alternatively, the first silicon film 203 may be a non-doped silicon film, and the second silicon film 204 may be a doped silicon film, or vice versa.

Second Embodiment

Figure 7:
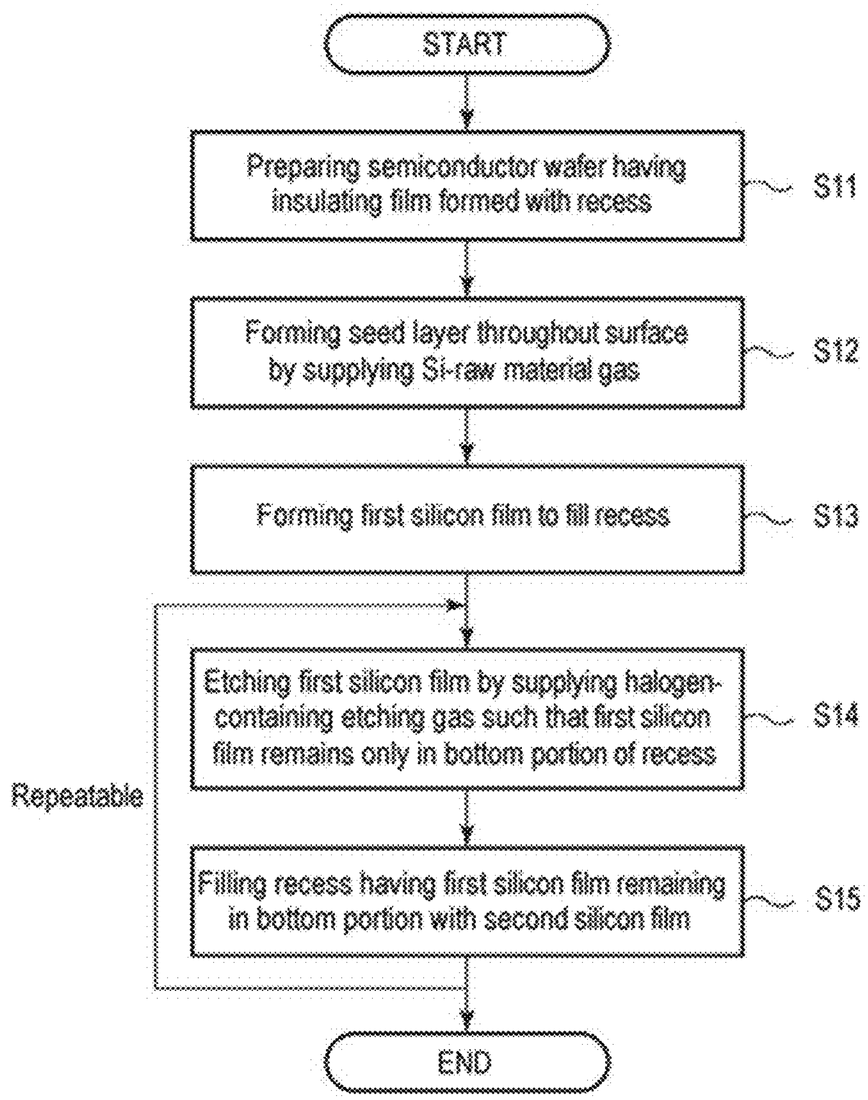
FIG. 7 is a flowchart showing the second embodiment of a silicon film forming method, according to the present disclosure.

Now, the second embodiment of a silicon film forming method, according to the present disclosure, will be described with reference to the flowchart of FIG. 7 and the procedural sectional views of FIGS. 8A to 8E.

Figures 8A, 8B, 8C, 8D, 8E:
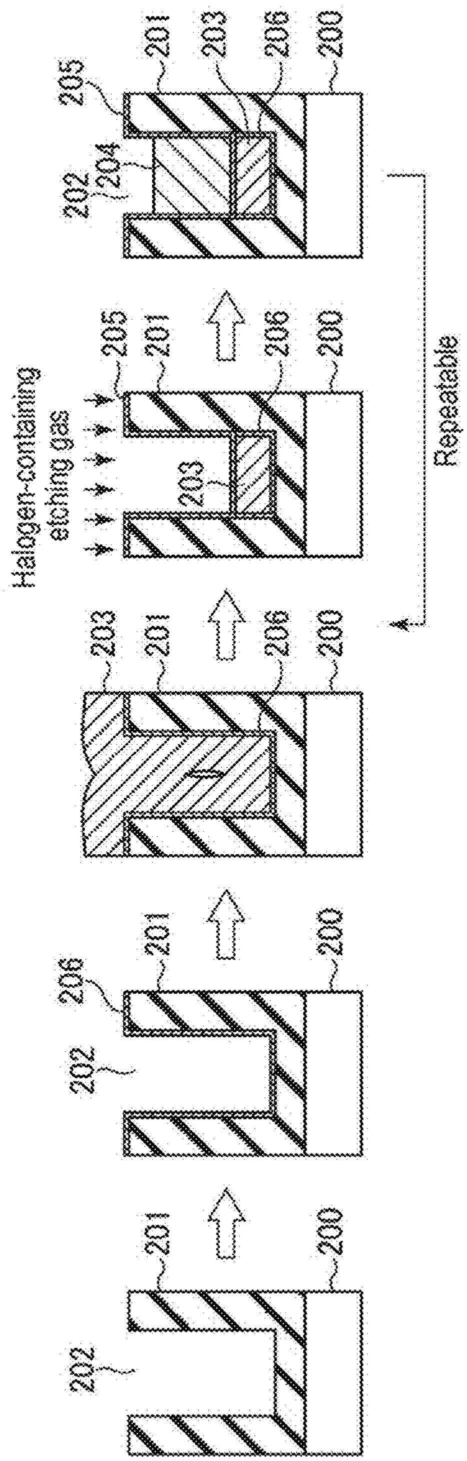
FIGS. 8A to 8E are procedural sectional views showing the second embodiment of a silicon film forming method, according to the present disclosure.

First, like the first embodiment, a wafer is prepared, which has an insulating film 201 formed of a $SiO_2$ film or a SiN film, and a recess 202 such as a trench or a hole formed in a predetermined pattern (Step S11, FIG. 8A).

Next, a seed layer 206 is formed on the entire surface of the wafer by supplying a Si raw material gas for a seed layer (Step S12, FIG. 8B). As the Si raw material gas for a seed layer, high-order silane-based compounds that contain two or more silicon elements in a molecule or amino-silane-based compounds may be used. By forming the seed layer 206, the roughness of a silicon film to be formed thereon can be reduced. The high-order silane-based compounds to be used as the Si raw material gas for the seed layer, for example, may be disilane ($Si_2H_6$), trisilane ($Si_3H_8$), tetrasilane ($Si_4H_{10}$), or the like. In addition, the amino-silane-based compounds to be used as the Si raw material gas for the seed layer, for example, may be BAS (butyl-amino-silane), BTBAS (bistert-butyl-amino-silane), DMAS (dimethyl-amino-silane), BDMAS (bisdimethyl-amino-silane), DPAS (dipropyl-amino-silane), DIPAS (diisopropylamino-silane), or the like. Of course, other high-order silane-based compounds or other amino-silane-based compounds may be used. The thickness of the seed layer 206 is preferably 1 to 2 nm. At this time, the processing temperature may be, preferably, 300 to 400 degrees C. In the case of using the amino-silane-based compounds, the processing temperature may be preferably set to fall within the range in which the thermal decomposition does not occur.

Subsequently, a first film forming process is performed to form a first silicon film 203 to fill the recess 202 (Step S13, FIG. 8C). At this time, as the Si raw material gas, silicon compounds other than the amino-silane-based compounds may be preferably used. Other conditions are the same as Step S2 of the first embodiment.

Next, the first silicon film 203 that is formed in the first film forming process is etched by supplying a halogen-containing etching gas onto the wafer such that the first amorphous silicon film 203 remains only in the bottom portion of the recess 202 (Step S14, FIG. 8D). This etching process may be exactly the same as Step S3 of the first embodiment.

Then, a second film forming process is performed to form a second silicon film 204 to fill the recess 202 in which the first silicon film 203 remains in the bottom portion (Step S15, FIG. 8E). The second film forming process may be exactly the same as Step S4 of the first embodiment.

The etching of Step S14 and the second film forming process of Step S15 may be performed one time, or may be repeated several times until the film reaches a predetermined filling height.

Example of Silicon Film Forming Apparatus

Figure 9:
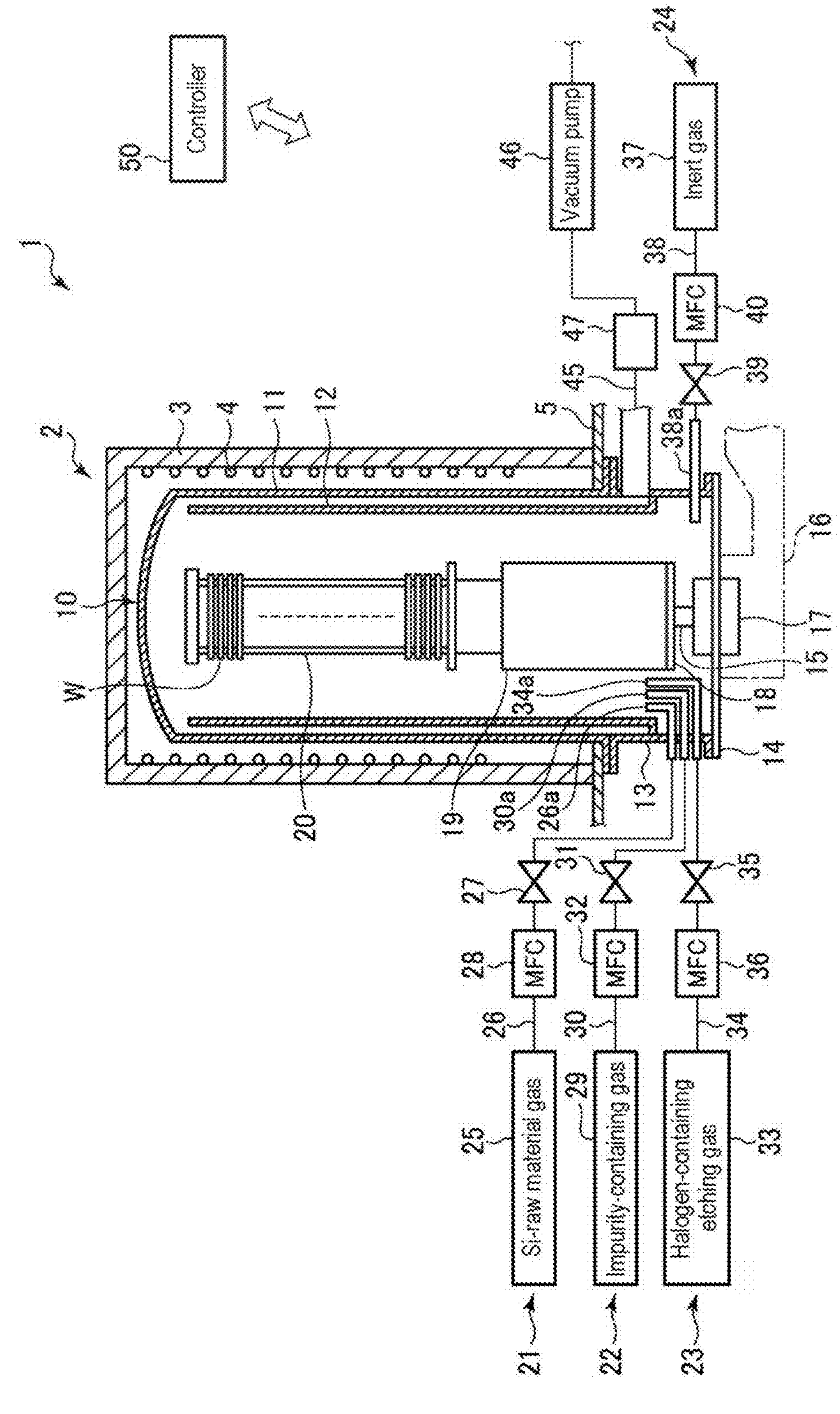
FIG. 9 is a longitudinal sectional view showing an example of a silicon film forming apparatus that can be used for performing the silicon film forming method of the present disclosure.

Now, an example of a silicon film forming apparatus that can be used to perform the silicon film forming method of the present disclosure will be described. FIG. 9 is a longitudinal sectional view showing a film forming apparatus that is an example of the silicon film forming apparatus.

The film forming apparatus 1 includes a heating furnace 2 having a cylindrical insulating body 3 with a ceiling and a heater 4 installed on the inner circumferential surface of the insulating body 3. The heating furnace 2 is installed on a base plate 5.

A process chamber 10 is inserted into the heating furnace 2. The process chamber 10 has a double-tube structure where an outer tube 11 with a closed top made of, for example, quartz is provided while an inner tube 12 made of, for example, quartz is concentrically arranged inside the outer tube 11. In addition, the heater 4 is installed to surround the outer surface of the process chamber 10.

The lower ends of the outer tube 11 and the inner tube 12 are supported by a manifold 13 which is made of stainless steel or the like in a cylindrical shape, and a cap 14 is installed in the bottom opening of the manifold 13 to open and close the same in order to hermetically seal the opening.

A rotary shaft 15 passes through the center of the cap 14 to be rotatable in the hermetical state by means of, for example, a magnetic seal, wherein the lower end of the rotary shaft 15 is coupled to a rotating mechanism 17 of an elevation unit 16 and the upper end thereof is coupled to a turntable 18. A wafer boat 20 which is a substrate holder made of quartz to hold semiconductor wafers (hereinafter, simply referred to as wafers) as target substrates is loaded on the turntable 18 with a heat insulating container 19 interposed therebetween. The wafer boat 20 is configured to receive, for example, 50 to 150 sheets of wafers (W) and stack them in a predetermined pitch.

In addition, the elevation unit 16 is elevated by a lifting mechanism (not shown) so as to load the wafer boat 20 into or discharge the wafer boat 20 out of the process chamber 10. When the wafer boat 20 is loaded into the process chamber 10, the cap 14 makes close contact with the manifold 13 to form an airtight seal therebetween.

Further, the film forming apparatus 1 includes: a Si raw material gas supply mechanism 21 which introduces a Si raw material gas into the process chamber 10; an impurity-containing gas supply mechanism 22 which introduces an impurity-containing gas into the process chamber 10; a halogen-containing etching gas supply mechanism 23 which introduces an etching gas into the process chamber 10; and an inert gas supply mechanism 24 which introduces an inert gas to be used as a purge gas into the process chamber 10. The Si raw material gas supply mechanism 21, the impurity-containing gas supply mechanism 22, the halogen-containing etching gas supply mechanism 23, and the inert gas supply mechanism 24 constitute a gas supply unit.

The Si raw material gas supply mechanism 21 includes: a Si raw material gas supply source 25; a Si raw material gas pipe 26 for guiding the film forming gas from the Si raw material gas supply source 25; and a Si raw material gas nozzle 26*a* made of quartz and connected to the Si raw material gas pipe 26. The Si raw material gas nozzle 26*a* is installed to pass through the lower portion of the side wall of the manifold 13. A valve 27 and a flow rate controller 28 such as a mass flow controller are installed in the Si raw material gas pipe 26, thereby supplying the Si raw material gas while controlling a flow rate of the Si raw material gas.

The impurity-containing gas introduction supply mechanism 22 includes: an impurity-containing gas supply source 29; an impurity-containing gas pipe 30 for guiding an impurity-containing gas from the impurity-containing gas supply source 29; and an impurity-containing gas nozzle 30*a* made of quartz and connected to the impurity-containing gas pipe 30. The impurity-containing gas nozzle 30*a* is installed to pass through the lower portion of the side wall of the manifold 13. A valve 31 and a flow rate controller 32 such as a mass flow controller are installed in the impurity-containing gas pipe 30, thereby supplying the impurity-containing gas while controlling a flow rate of the impurity-containing gas.

The halogen-containing etching gas supply mechanism 23 includes: an etching gas supply source 33 for supplying a halogen-containing etching gas; an etching gas pipe 34 for guiding an etching gas from the etching gas supply source 33; and an etching gas nozzle 34*a* made of quartz and connected to the etching gas pipe 34. The etching gas nozzle 34*a* is installed to pass through the lower portion of the side wall of the manifold 13. A valve 35 and a flow rate controller 36 such as a mass flow controller are installed in the etching gas pipe 34, thereby supplying the etching gas while controlling a flow rate of the etching gas.

The inert gas supply mechanism 24 includes: an inert gas supply source 37; an inert gas pipe 38 for guiding an inert gas from the inert gas supply source 37; and an inert gas nozzle 38*a* connected to the inert gas pipe 38 and installed to pass through the lower portion of the side wall of the manifold 13. A valve 39 and a flow rate controller 40 such as a mass flow controller are installed in the inert gas pipe 38.

As described above, arbitrary Si-containing compounds can be used as the Si raw material gas, which is supplied from the Si raw material gas supply mechanism 21, as long as the Si-containing compounds can be applied to the CVD method. However, silane-based compounds and amino-silane-based compounds may be suitably used.

As described above, As, B, and P are exemplified as impurities, and $AsH_3$, $B_2H_6$, $BCl_3$, and $PH_3$ may be used as the impurity-containing gas that is supplied from the impurity-containing gas supply mechanism 22.

As described above, the etching gas that is supplied from the etching gas supply mechanism 23 may be any gas that can remove silicon, and may be, preferably, $Cl_2$, HCl, $F_2$, $Br_2$, HBr, or the like.

A rare gas such as an $N_2$ gas or an Ar gas may be used as the inert gas that is supplied from the inert gas supply mechanism 24.

In addition, in the case where the first silicon film and the second silicon film are formed out of different Si raw material gases, the Si raw material gas supply mechanism 21 having two Si raw material gas supply sources 25 for supplying two types of Si raw material gases may be used. Further, in a case of forming the seed layer as described in the second embodiment of the silicon film forming method, a Si raw material gas supply mechanism for a seed layer may be separately installed, which has exactly the same configuration as the Si raw material gas supply mechanism 21, thereby supplying a Si raw material gas for the seed layer into the process chamber 10.

An exhaust pipe 45 is coupled to the upper portion of the side wall of the manifold 13 in order to exhaust process gases from the gap between the outer tube 11 and the inner tube 12. The exhaust pipe 45 is connected to a vacuum pump 46 for evacuating the process chamber 10, and a pressure control mechanism 47 including a pressure control valve is installed in the exhaust pipe 45. In addition, the pressure in the process chamber 10 is adjusted to a predetermined value by the pressure control mechanism 47 while evacuating the process chamber 10 by means of the vacuum pump 46.

Also, the film forming apparatus 1 includes a controller 50. The controller 50 includes: a main control unit having a computer (CPU) for controlling elements of the film forming apparatus 1, for example, valves, a mass flow controller controlling a flow rate, or driving mechanisms such as a lifting mechanism, or a power for a heater; an input device such as a keyboard or a mouse; an output device; a display device; and a storage device. The main control unit of the controller 50 may set a storage medium in which process recipes are stored in the storage device, and may perform a predetermined process in the film forming apparatus 1 based on the process recipe retrieved from the storage medium. According to this, the film forming apparatus 1 may perform the silicon film forming method described above under the control of the computer.

Now, when the silicon film forming method is performed as described above by the film forming apparatus configured as described above, the process operation thereof will be described. The following process operation is performed by the controller 50 based on the process recipes stored in the storage medium of the storage unit.

First, for example, 50 to 150 sheets of semiconductor wafers (W) having an insulating film in which a recess such as a trench or a hole is formed in a predetermined pattern as described above are loaded on the wafer boat 20, and the wafer boat 20 on which the wafers (W) are loaded is placed on the turntable 18 while the heat insulating container 19 is interposed therebetween. Then, the wafer boat 20 is loaded into the process chamber 10 through the bottom opening by lifting the elevation unit 16.

At this time, the heater 4 pre-heats the inside of the process chamber 10 such that the temperature of the central portion (the central portion in the vertical direction) of the wafer boat 20 reaches a predetermined value suitable for the forming of the first silicon film for example, a predetermined temperature in the range of 300 to 700 degrees C. In addition, the pressure in the process chamber 10 is adjusted to 0.1 to 10 Torr (13.3 to 1,333 Pa), and a Si raw material gas, for example, a $SiH_4$ gas is supplied into the process chamber 10 (the inner tube 12) through the Si raw material gas pipe 26 from the Si raw material gas supply source 25 while the valve 27 is open. Then, the first silicon film forming process is carried out while rotating the wafer boat 20. At this time, the gas flow rate is controlled to be a predetermined value in the range of 50 to 5000 sccm by means of the flow rate controller 28. At this time, a predetermined amount of predetermined impurity-containing gas may be introduced from the impurity-containing gas supply source 29 while supplying the Si raw material gas by opening the valve 31. According to this, the recess in the insulating film is filled with the first silicon film. The first silicon film forming process in the process chamber 10 is terminated while closing the valve 27 after a certain amount of time has lapsed so that the film has a predetermined thickness.

Subsequently, the process chamber 10 is evacuated by the vacuum pump 46 through the exhaust pipe 45, and at the same time, the valve 39 is opened to supply an inert gas such as an $N_2$ gas into the process chamber 10 from the inert gas supply source 37, thereby purging the interior of the process chamber 10. Then, the temperature in the process chamber 10 is adjusted to a predetermined value in the range of 200 to 500 degrees C. by the heater 4. Next, the valve 39 is closed and the valve 35 is opened to supply a predetermined etching gas, for example, a $Cl_2$ gas into the process chamber 10 from the halogen-containing etching gas supply source 33 through the etching gas pipe 34, so that the first silicon film is etched. At this time, the etching is performed from the upper portion of the wafer until the insulating film on the surface of the wafer and on the upper portion of the inner wall of the recess is exposed and such that the first silicon film remains only in the bottom portion thereof. The valve 35 is closed after a certain amount of time passes for which it takes to arrive at this state, and the etching is terminated.

Subsequently, the process chamber 10 is evacuated by means of the vacuum pump 46 through the exhaust pipe 45, and at the same time, the interior of the process chamber 10 is purged by supplying an inert gas such as an $N_2$ gas into the process chamber 10 from the inert gas supply source 37 while the valve 39 is opened. Then, the temperature of the process chamber 10 is adjusted to a predetermined valve in the range of 300 to 700 degrees C. by the heater 4.

Next, after the pressure of the process chamber 10 is adjusted to 0.1 to 10 Torr (13.3 to 1,333 Pa), the valve 27 is opened to supply a Si raw material gas, for example, a $SiH_4$ gas into the process chamber 10 from the Si raw material gas supply source 25 through the Si raw material gas pipe 26, to form the second silicon film on the wafer. At this time, the gas flow rate is controlled to be a predetermined value in the range of 50 to 5000 sccm by means of the flow rate controller 28. At this time, a predetermined amount of predetermined impurity-containing gas may be introduced from the impurity-containing gas supply source 29 by opening the valve 31 while supplying the Si raw material gas. In the second silicon film forming, the exposed surfaces of the insulating film on the surface of the wafer and on the upper portion of the inner wall of the recess become inactivated because a halogen element of the etching gas, for example, Cl is adsorbed onto the same, so that the second silicon film is not formed thereon. However, the second silicon film can be formed only on the first silicon film that remains at the bottom of the recess. Due to this, the second silicon film may grow upward in the bottom-up growth manner in the recess, and a voidless silicon film can be formed even in the fine recess. The valve 27 or the valves 27 and 31 are closed after a predetermined period of time corresponding to a predetermined film thickness, and the second silicon film forming process is terminated.

The etching of the first silicon film and the forming of the second silicon film may be performed several times with the supply of the halogen-containing gas.

After the first silicon film forming process is completed, the process chamber 10 is evacuated by means of the vacuum pump 46 through the exhaust pipe 45, and the interior of the process chamber 10 is purged by means of the inert gas. Then, the pressure in the process chamber 10 returns to the atmospheric pressure, and the elevation unit 16 is lowered to discharge the wafer boat 20 out of the process chamber 10.

In the case of forming the seed layer prior to the first silicon film forming as in the second embodiment above, the wafer boat 20 is loaded into the process chamber 10, and the process chamber 10 is pre-heated by the heater 4 such that the temperature of the central portion (the central portion in the vertical direction) of the wafer boat 20 reaches a predetermined value suitable for the forming of the seed layer, for example, a predetermined temperature in the range of 250 to 450 degrees C. Then, the pressure of the process chamber 10 is adjusted to 0.1 to 10 Torr (13.3 to 1,333 Pa), and a Si raw material gas for a seed layer, for example, high-order silane-based compound gases or amino-silane-based compound gases is supplied into the process chamber 10 by opening the valve of a Si raw material gas supply mechanism for a seed layer (not shown) that has exactly the same configuration as the Si raw material gas supply mechanism 21. At this time, the gas flow rate is controlled to be a predetermined value in the range of 10 to 1,000 sccm. By doing this, a seed layer having a thickness of 1 to 2 nm is formed on the entire surface of the wafer. In such a state, the first silicon film forming process, the etching, and the second silicon film forming process are perform in sequence as described above. Accordingly, the roughness of the silicon film may be reduced.

The detailed film forming conditions may be exemplified as follows.

Detailed Example 1

Insulation film: $SiO_2$ film
First silicon film 203 (amorphous silicon)
Non-doped silicon
Silicon raw material gas: $SiH_4$
Film forming temperature: 530 degrees C.
Pressure: 0.45 Torr (60 Pa)
Etching
Etching gas: $Cl_2$ gas
Temperature: 350 degrees C.
Pressure: 0.15 Torr (20 Pa)
Second silicon film 204 (amorphous silicon)

Boron-doped silicon
Silicon raw material gas: $SiH_4$
Doping gas: $BCl_3$
Film forming temperature: 350 degrees C.
Pressure: 4.5 Torr (600 Pa)

Detailed Example 2

Insulation film: $SiO_2$ film
First silicon film 203 (amorphous silicon)
Boron-doped silicon
Silicon raw material gas: $SiH_4$
Doping gas: $BCl_3$
Film forming temperature: 350 degrees C.
Pressure: 4.5 Torr (600 Pa)
Etching
Etching gas: $Cl_2$ gas
Temperature: 350 degrees C.
Pressure: 0.15 Torr (20 Pa)
Second silicon film 204 (amorphous silicon)
Boron-doped silicon
Silicon raw material gas: $SiH_4$
Doping gas: $BCl_3$
Film forming temperature: 350 degrees C.
Pressure: 4.5 Torr (600 Pa)

In addition, when a seed layer is formed in examples 1 and 2, the conditions may be exemplified as follows.

Seed layer
Silicon raw material gas: $Si_2H_6$
Forming temperature: 350 degrees C.
Pressure: 1 Torr (133 Pa)

EXPERIMENT

Next, an experiment will be described.

Figures 10A, 10B, 10C:
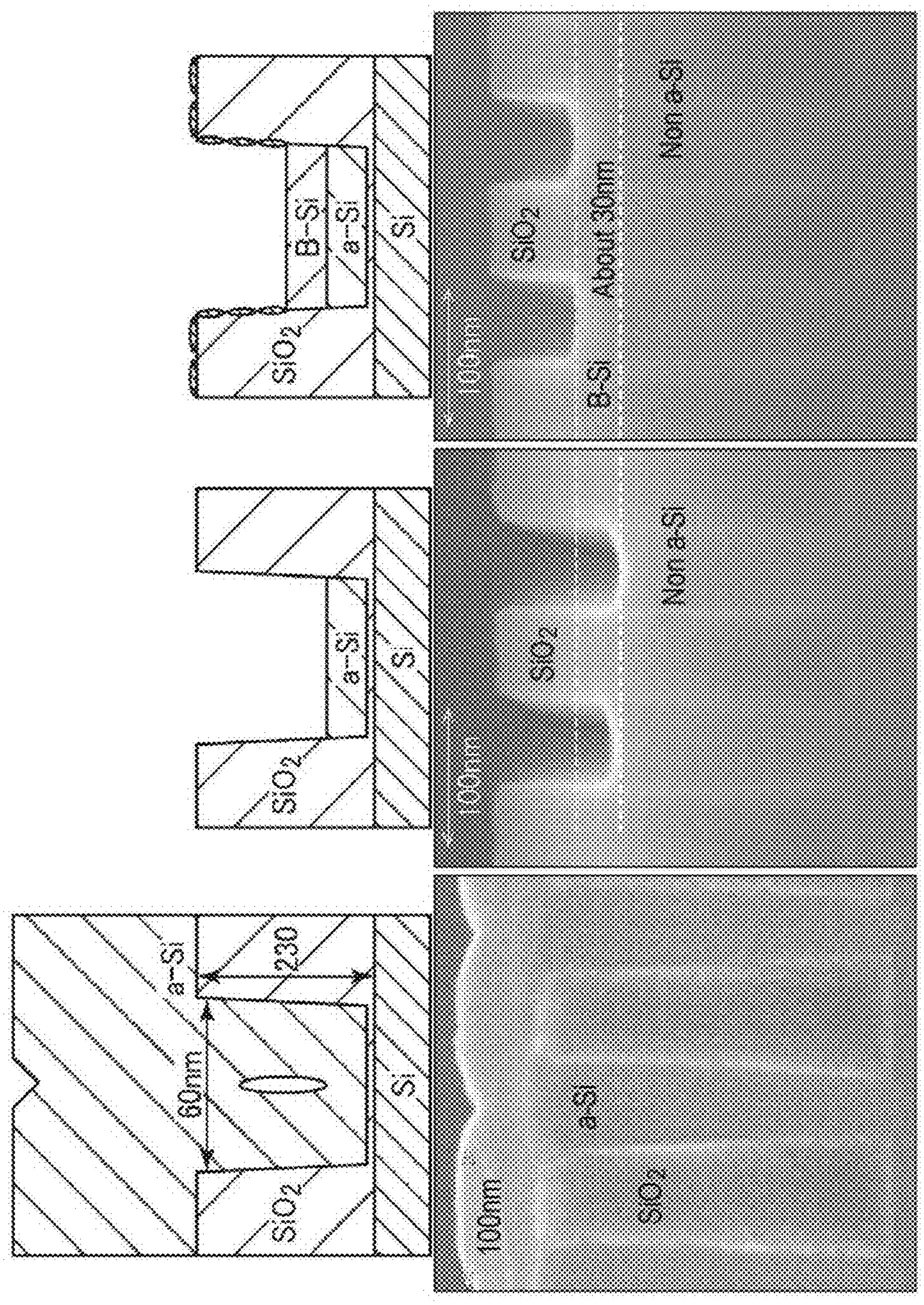
FIGS. 10A to 10C illustrate SEM photographs showing sections of a sample wafer in each process of experiments.

FIGS. 10A to 10C illustrate SEM photographs showing sections of a sample wafer in each process of the experiment.

FIG. 10A shows the state in which a non-doped amorphous silicon film (a-Si film) is formed to have a thickness of 60 nm on a sample wafer in which a trench having a width of 60 nm and a depth of 230 nm is formed in a predetermined pattern on the $SiO_2$ film formed on the Si substrate by using a $SiH_4$ gas as a Si raw material at a temperature of 530 degrees C. Thereafter, the a-Si film was etched by a depth of 150 nm using a $Cl_2$ gas at 350 degrees C. Such a state is shown in FIG. 10B. The $SiO_2$ film is exposed on the surface of the wafer and on the inner wall of the upper portion of the trench. Then, a boron-doped silicon film (B—Si film) was formed to have a thickness of 30 to 35 nm at 350 degrees C. using a $SiH_4$ gas as a Si raw material and $BCl_3$ as an impurity-raw material. Such a state is shown in FIG. 10C. It can be seen that the B—Si film grows up in the bottom-up manner on the a-Si film and, i.e., a reliable film without voids grows. From the above, it is confirmed that the present method is effective for filling a fine recess with a silicon film without voids.

<Other Applications>

Until now, although the embodiments of the present disclosure have been described, the present disclosure is not limited to the embodiments above, and may be variously modified without departing from the scope of the present disclosure.

For example, although the embodiments described above show that the method of the present disclosure is performed by the longitudinal batch type of apparatus, it is not limited thereto, and the method may be performed by other various film forming apparatuses, such as the horizontal batch type apparatus or the single-wafer type apparatus. In addition, although the embodiments show that all the processes are performed by a single apparatus, some of the processes (for example, the etching) may be performed by another apparatus.

Furthermore, although the semiconductor wafer is illustrated to be used as a target substrate, it is not limited thereto, and it is also possible that the present disclosure can be applied to other substrates such as a glass substrate for flat panel displays or a ceramic substrate.

According to the present disclosure, when forming a silicon film in a recess with respect to a target substrate having on its surface an insulating film in which a recess is formed, the first silicon film is formed to fill the recess by supplying a Silicon raw material gas onto the target substrate, and the first silicon film is etched by supplying a halogen-containing etching gas onto the target substrate such that the surfaces of the insulating film on the surface of the target substrate and on the upper portion of the inner wall of the recess are exposed and such that the first silicon film remains in the bottom portion of the recess. Therefore, the halogen element is adsorbed onto the surface of the target substrate and onto the upper portion of the inner wall of the recess, so that the portions become inactivated and the incubation time thereof is increased. Therefore, during the subsequent film forming process of the second silicon film, it is possible to grow the second silicon film by the bottom-up growth manner on the first silicon film. Accordingly, it is possible to form a silicon film without voids even in a fine recess.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A silicon film forming method of forming a silicon film in a recess with respect to a target substrate having on its surface an insulating film in which the recess is formed therein, the method comprising:

(a) forming a first silicon film to fill the recess by supplying a silicon raw material gas onto the target substrate until surfaces of the insulating film on the surface of the target substrate are covered with the first silicon film and the recess is occluded by the first silicon film;

(b) subsequently, etching the first silicon film by supplying a halogen-containing etching gas onto the target substrate until the surfaces of the insulating film on the surface of the target substrate and on an upper portion of an inner wall of the recess are exposed and the first silicon film remains in a bottom portion of the recess; and (c) subsequently, growing a second silicon film in a bottom-up growth manner on the first silicon film that remains in the bottom portion of the recess by supplying a silicon raw material gas onto the target substrate after the etching.

2. The method according to claim 1, wherein an adsorption layer containing a halogen element is formed on the exposed surface of the insulating film by process (b).

3. The method according to claim 1, wherein the silicon raw material gas used in processes (a) and (c) is a silane-based compound or an amino-silane-based compound.

4. The method according to claim 1, further comprising (d) forming a seed layer on the surface of the insulating film by supplying a silicon raw material gas onto the target substrate, process (d) being performed prior to process (a).

5. The method according to claim 4, wherein the silicon raw material gas used in process (d) is a high-order silane-based compound or an amino silane compound.

6. The method according to claim 1, wherein the first silicon film is a non-doped silicon film or a doped silicon film, and the second silicon film is a non-doped silicon film or a doped silicon film.

7. The method according to claim 6, wherein the doped silicon film is a boron-doped silicon film.

8. The method according to claim 7, wherein the first silicon film is a non-doped silicon film, and the second silicon film is a boron-doped silicon film.

9. The method according to claim 7, wherein both the first silicon film and the second silicon film are boron-doped silicon films.

10. The method according to claim 1, wherein the halogen-containing etching gas is selected from $Cl_2$, HCl, $F_2$, $Br_2$, or HBr.

11. The method according to claim 10, wherein the insulating film is a $SiO_2$ film, and the halogen-containing etching gas is a $Cl_2$ gas.

12. The method according to claim 1, wherein processes (b) and (c) are repeated plural times.

13. The method according to claim 1, wherein processes (a) and (c) are performed at a temperature in a range of 300 to 600 degrees C.

14. The method according to claim 1, wherein process (b) is performed at a temperature in a range of 250 to 500 degrees C.

15. A non-transitory computer-readable storage medium that stores a program causing a computer to control a silicon film forming apparatus, wherein the program, when it is executed, causes the computer to control the silicon film forming apparatus to perform the silicon film forming method of claim 1.

* * * * *